(12) United States Patent
Sekine

(10) Patent No.: US 11,715,745 B2
(45) Date of Patent: Aug. 1, 2023

(54) IMAGE SENSOR AND METHOD OF CONTROLLING IMAGE SENSOR

(71) Applicant: TIANMA JAPAN, LTD., Kanagawa (JP)

(72) Inventor: Hiroyuki Sekine, Kanagawa (JP)

(73) Assignee: TIANMA JAPAN, LTD., Kawasaki (JP)

( * ) Notice: Subject to any disclaimer, the term of this patent is extended or adjusted under 35 U.S.C. 154(b) by 238 days.

(21) Appl. No.: 17/339,306

(22) Filed: Jun. 4, 2021

(65) Prior Publication Data

US 2021/0384238 A1 Dec. 9, 2021

(30) Foreign Application Priority Data

Jun. 5, 2020 (JP) .............................. JP2020-98935

(51) Int. Cl.
*H01L 27/146* (2006.01)
*H01L 29/786* (2006.01)

(52) U.S. Cl.
CPC .. *H01L 27/14603* (2013.01); *H01L 27/14638* (2013.01); *H01L 27/14692* (2013.01); *H01L 29/7869* (2013.01)

(58) Field of Classification Search
CPC ...... H04N 25/709; H04N 25/79; H04N 25/76; H01L 27/14603; H01L 27/14638; H01L 27/14692; H01L 27/1214; H01L 27/14636; H01L 27/14612; H01L 29/7869; H01L 29/78648
See application file for complete search history.

(56) References Cited

U.S. PATENT DOCUMENTS

| | | | |
|---|---|---|---|
| 10,741,606 B2 * | 8/2020 | Sekine | H01L 27/1225 |
| 2010/0328478 A1 * | 12/2010 | Tanaka | H01L 27/14676 348/E5.025 |
| 2016/0027827 A1 * | 1/2016 | Sekine | H01L 29/24 257/43 |
| 2016/0049523 A1 | 2/2016 | Yamada | |
| 2017/0082570 A1 | 3/2017 | Takechi et al. | |
| 2017/0214871 A1 | 7/2017 | Kanehara et al. | |
| 2018/0315792 A1 * | 11/2018 | Sekine | G01T 1/241 |

* cited by examiner

*Primary Examiner* — Lin Ye
*Assistant Examiner* — John H Morehead, III
(74) *Attorney, Agent, or Firm* — Nixon & Vanderhye

(57) ABSTRACT

An image sensor is disclosed. A first thin-film transistor includes a first gate and a second gate. The first gate is supplied with a signal generated by a photoelectric conversion element. The second gate is supplied with a potential different from a potential of a first signal line by a predetermined voltage through a second signal line. The second gate has a smaller capacitance than the first gate. A second thin-film transistor supplies a reset potential received from a reset power line to the photoelectric conversion element. Whether a third thin-film transistor is in a conductive state is controlled by a selection signal. The third thin-film transistor is disposed between the first signal line and the first thin-film transistor and the current from a constant current source flows into the first thin-film transistor via the third thin-film transistor in a conductive state.

6 Claims, 7 Drawing Sheets

IMAGE SENSOR AND METHOD OF CONTROLLING IMAGE SENSOR

CROSS-REFERENCE TO RELATED APPLICATIONS

This non-provisional application claims priority under 35 U.S.C. § 119(a) on Patent Application No. 2020-098935 filed in Japan on Jun. 5, 2020, the entire content of which is hereby incorporated by reference.

BACKGROUND

This disclosure relates to an image sensor and a method of controlling an image sensor, and particularly to a technique to improve the characteristics of an image sensor including thin-film transistors.

Flat panel detectors (FPDs) are known as a type of image sensors. The FPDs can be used for X-ray fluoroscopy and have been improved to have higher resolution. The pixel size reduced by this improvement results in reduction of the amount of signal, which lowers the signal-to-noise ratio (SNR) in conventional FPDs employing a passive pixel sensor (PPS) method.

A solution to this problem is an active pixel sensor (APS) method, which utilizes an amplifier circuit provided in each pixel. Complementary metal oxide semiconductor (CMOS) sensors fabricated on a crystalline silicon substrate employ this APS method.

The amplification of a signal in a CMOS sensor is performed by the same mechanism as the amplification in a charge coupled device (CCD), which is, a transistor completely transfers the charges in a photodiode to a floating diffusion amplifier.

SUMMARY

An aspect of this disclosure is an image sensor including: an insulating substrate; a plurality of pixels on the insulating substrate; and a constant current source. Each of the plurality of pixels includes: a photoelectric conversion element; a first thin-film transistor having a first gate and a second gate disposed to sandwich a channel; a second thin-film transistor; and a third thin-film transistor. The first gate is supplied with a signal generated by the photoelectric conversion element. The constant current source supplies a constant current to the first thin-film transistor through a first signal line. The second gate is supplied with a potential different from a potential of the first signal line by a predetermined voltage through a second signal line. The second gate has a smaller capacitance than the first gate. A gate of the second thin-film transistor is supplied with a reset control signal. The second thin-film transistor supplies a reset potential received from a reset power line to the photoelectric conversion element. Whether the third thin-film transistor is in a conductive state is controlled by a selection signal input to the gate of the third thin-film transistor. The third thin-film transistor is disposed between the first signal line and the first thin-film transistor and the current from the constant current source flows into the first thin-film transistor via the third thin-film transistor in a conductive state.

An aspect of this disclosure is a method of controlling an image sensor including an insulating substrate and a plurality of pixels on the insulating substrate. Each of the plurality of pixels includes a photoelectric conversion element, a first thin-film transistor having a first gate and a second gate disposed to sandwich a channel in a layering direction, a second thin-film transistor, and a third thin-film transistor disposed between a first signal line and the first thin-film transistor. The second gate has a smaller capacitance than the first gate. The first gate is configured to be supplied with a signal generated by the photoelectric conversion element. The method includes: supplying a selection signal to a gate of the third thin-film transistor to control whether the third thin-film transistor is in a conductive state and supplying a constant current to the first thin-film transistor through the first signal line; supplying a potential different from a potential of the first signal line by a predetermined voltage to the second gate through a second signal line; outputting a potential corresponding to a potential of the first signal line; supplying a reset control signal to a gate of the second thin-film transistor; and supplying a reset potential of a reset power line to the photoelectric conversion element via the second thin-film transistor.

It is to be understood that both the foregoing general description and the following detailed description are exemplary and explanatory and are not restrictive of this disclosure.

EMBODIMENTS

Figure 1:
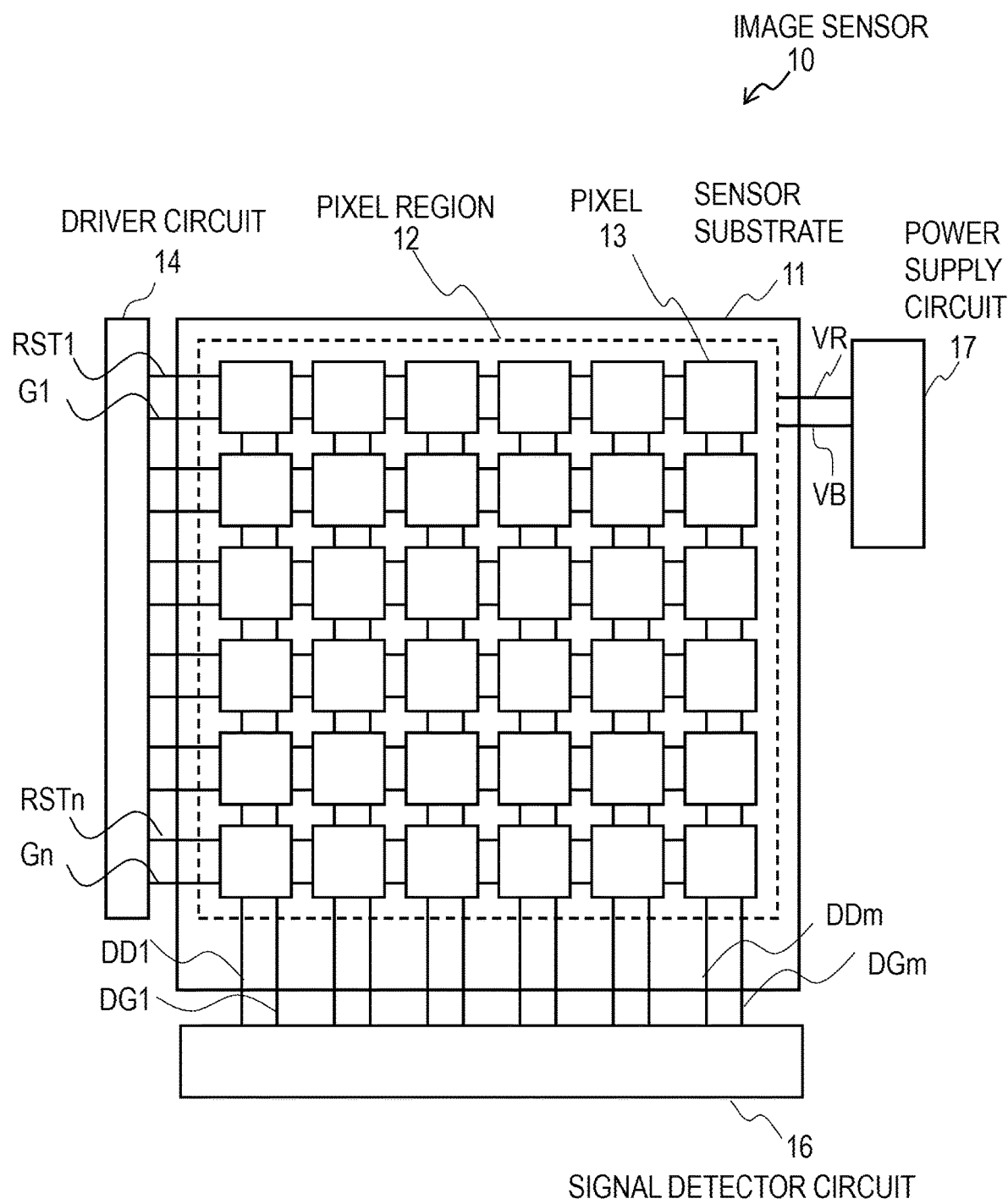
FIG. 1 is a block diagram illustrating a configuration example of an image sensor related to an embodiment of this disclosure.

Hereinafter, the image sensor of this disclosure is described in detail with reference to the accompanying drawings. The elements in each drawing are changed in size or scale as appropriate to be recognized in the drawing. The hatches in the drawings are to distinguish the elements and are not to represent cross-sections.

The image sensor of this disclosure is applicable to radiographic imaging devices in the fields of medical and industrial non-destructive testing. The image sensor disclosed herein includes pixels each including an amplifier circuit and a circuit for reading signals of the pixels. The light to be detected is electromagnetic rays having any frequency, which can be infrared rays, visible light, or X-rays.

The amplifier circuit in a pixel includes an amplifier thin-film transistor having a top gate (first gate) and a bottom gate (second gate). The signal of a photoelectric conversion element included in the pixel is supplied to either the top gate or the bottom gate of the amplifier thin-film transistor. The reader circuit includes a constant current source for supplying a constant current to the amplifier thin-film transistor via a first signal line. The reader circuit further supplies a potential different from the potential for the first signal line by a predetermined voltage to the other gate of the amplifier thin-film transistor. The potential of the first signal line is based on the signal of the photoelectric conversion element and the capacitances of the two gates of the amplifier thin-film transistor. The amplification rate of the signal of the photoelectric conversion element can be determined by designing the two gate capacitances.

Hereinafter, embodiments of this disclosure are described specifically. FIG. 1 is a block diagram illustrating a configuration example of an image sensor related to an embodiment of this disclosure. The image sensor 10 of this disclosure includes a sensor substrate 11 and control circuits. The control circuits include a driver circuit 14, a signal detector circuit 16, and a power supply circuit 17.

The sensor substrate 11 includes an insulative substrate (such as a glass substrate) and a pixel region 12 in which pixels 13 are disposed like a horizontal and vertical matrix on the insulative substrate. In this description, the frequency of the light to be detected is not limited. The pixel region 12 may include a scintillator that emits fluorescence in response to radial rays to be detected.

The driver circuit 14 drives the pixels 13 to detect light with the pixels 13. Pairs of a reset control line and a selection line extend from the driver circuit 14 to individual pixel rows; each pixel 13 in a pixel row is connected with the reset control line and the selection line for the pixel row. A pixel row consists of pixels aligned horizontally in FIG. 1. Pixels aligned vertically in FIG. 1 constitute a pixel column.

In the example in FIG. 1, the reset control line and the selection line for the uppermost pixel row are denoted by reference signs RST1 and G1, respectively. Furthermore, the reset control line and the selection line for the lowermost pixel row are denoted by reference signs RSTn and Gn, respectively, where n is an integer more than 1 and corresponds to the number of pixel rows. In the following description, given reset control line and selection line are denoted by reference signs RSTk and Gk, respectively, where k is one of the integers 1 to n.

The reset control line RSTk transmits a reset control signal for selecting the pixel row k to be reset. The selection line Gk transmits a selection signal for selecting the pixel row k to read a signal (photodetection signal) corresponding to the amount of detected light from each pixel. The driver circuit 14 selects the pixel rows to read photodetection signals one after another with the selection signal for the selection lines G1 to Gn and selects the pixel rows to be reset one after another with the reset control signal for the reset control lines RST1 to RSTn.

The power supply circuit 17 supplies power supply potentials to the pixels 13. Two power lines VR and VB extend from the power supply circuit 17 to the pixel region 12. The power lines VB and VR extend within the pixel region to be connected with all pixels 13. The power lines VB and VR supply the pixels 13 with constant power supply potentials. As will be described later, the power line (reset power line) VR supplies a reset potential to reset the pixels 13. The power line VB supplies a reference potential.

The signal detector circuit 16 detects a signal from each pixel 13. The signal detector circuit 16 simultaneously reads signals corresponding to the amounts of detected light from the pixels in a pixel row selected by the driver circuit 14. Pairs of a first signal line and a second signal line extend from the signal detector circuit 16 to individual pixel columns; each pixel 13 in a pixel column is connected with the first signal line and the second signal line for the pixel column.

The first signal line and the second signal line for the leftmost pixel column are denoted by reference signs DD1 and DG1, respectively. Furthermore, the first signal line and the second signal line for the rightmost pixel column are denoted by reference signs DDm and DGm, respectively, where m is an integer more than 1 and corresponds to the number of pixel columns. In the following description, given first signal line and second signal line are denoted by reference signs DDj and DGj, respectively, where j is one of the integers 1 to m. As will be described later, the potentials of the signal lines DD and DG both vary in accordance with the detection signal of the photoelectric conversion element of a pixel 13 to indicate the level of the photodetection signal of the pixel 13 (the amount of light detected at the pixel 13).

The driver circuit 14 and the signal detector circuit 16 in the example of FIG. 1 are fabricated as components separate from the sensor substrate 11 and they are mounted on a silicon substrate, for example. These circuits can be included in different IC chips. Some or all of them can be included in the same IC chip. One circuit can be included in a plurality of IC chips.

Figure 2:
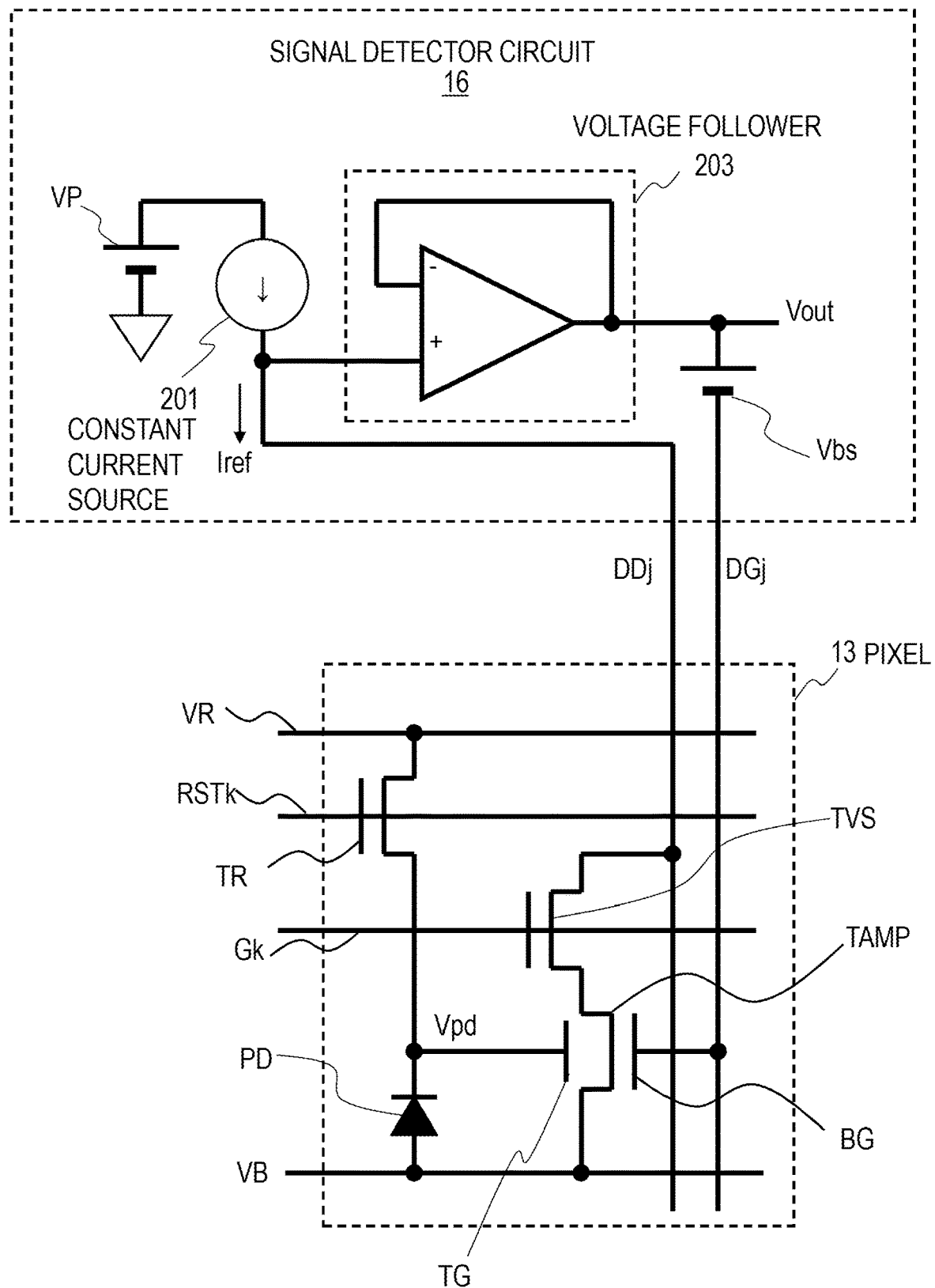
FIG. 2 is a circuit diagram illustrating a configuration of the circuit of one pixel and a part of a signal detector circuit.

FIG. 2 is a circuit diagram illustrating a configuration of the circuit of one pixel 13 and a part of the signal detector circuit 16. One pixel 13 of the image sensor of this disclosure includes an amplifier transistor TAMP, a reset transistor TR, a selection transistor TVS, and a photodiode PD. The amplifier transistor TAMP, the reset transistor TR, the selection transistor TVS, and the photodiode PD are examples of a first thin-film transistor, a second thin-film transistor, a third thin-film transistor, and a photoelectric conversion element, respectively.

The photodiode PD is an example of a photoelectric conversion element for converting light to electric charge; it generates a photodetection signal corresponding to the amount of received light. Different types of photoelectric conversion element can be employed. The three transistors TAMP, TR, and TVS are thin-film transistors. They can be any kinds of thin-film transistors; oxide semiconductor thin-film transistors are one example and polysilicon thin-film transistors are another example.

The amplifier transistor TAMP amplifies the potential (photodetection signal) at one end of the photodiode PD. The amplifier transistor TAMP in an embodiment of this disclosure has a double-gate structure. The double-gate structure in this description includes a top gate TG and a bottom gate BG across a channel.

In the example of FIG. 2, the cathode of the photodiode PD is connected with the top gate of the amplifier transistor TAMP and the source of the reset transistor TR, and the anode of the photodiode PD is connected with the power line VB for supplying a reference potential. The reset transistor TR resets the potentials of the photodiode PD and the top gate of the amplifier transistor TAMP. The drain of the reset transistor TR is connected with the power line VR for supplying a reset potential. The reset potential of the power line VR is higher than the reference potential of the power line VB. The gate of the reset transistor TR is connected with the associated reset control line RST.

The source of the amplifier transistor TAMP is connected with the power line VB and the drain of the amplifier transistor TAMP is connected with the source of the selection transistor TVS. The bottom gate of the amplifier transistor TAMP is connected with the associated signal line DGj. The drain of the selection transistor TVS is connected with the associated signal line DDj. The gate of the selection transistor TVS is connected with the associated selection line Gk. The selection transistor TVS controls the output of the pixel 13.

FIG. 2 further illustrates a circuit for reading the photodetection signal of the pixel 13 provided in the signal detector circuit 16. The signal detector circuit 16 includes reader circuits for individual pixel columns. The reader circuit includes a constant current source 201, a voltage follower 203, and a voltage source Vbs. The constant current source 201 is connected with a voltage source VP and outputs a constant current Iref to the signal line DDj.

The signal line DDj is connected with the non-inverting input of the operating amplifier of the voltage follower 203 to input the potential of the signal line DDj. The output of the operating amplifier is connected with the inverting input. The output of the operating amplifier is the output of the voltage follower, which is a potential Vout. The output potential Vout is equal to the potential of the signal line DDj.

The voltage source Vbs is connected between the output of the voltage follower 203 and the signal line DGj. In the example of FIG. 2, the potential of the signal line DGj is lower than the output voltage Vout of the voltage follower 203 by the voltage (constant voltage) of the voltage source Vbs. Accordingly, the potential lower than the output voltage Vout of the voltage follower 203 by a predetermined voltage is supplied to the bottom gate BG of the amplifier transistor TAMP. As a result, a constant current appropriately flows through the amplifier transistor TAMP.

Figure 3:
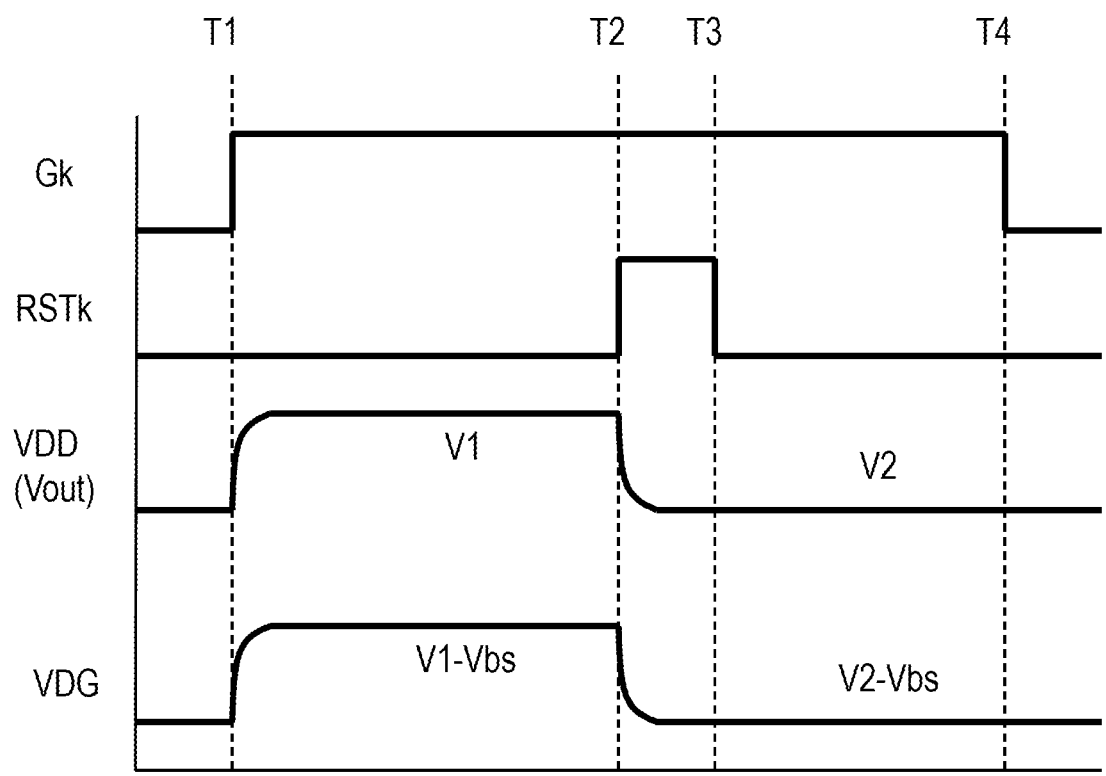
FIG. 3 is a timing chart of the signals in the circuit illustrated in FIG. 2.

FIG. 3 is a timing chart of the signals in the circuit illustrated in FIG. 2, and specifically, a timing chart to read the photodetection signal of one pixel. FIG. 3 shows temporal variation of the selection signal on the selection line Gk, the reset signal on the reset control line RSTk, the signal on the signal line DDj, and the signal on the signal line DGj.

At a time T1, the driver circuit 14 changes the selection signal on the selection line Gk from a low level to a high level. The potential of the signal line DDj increases to a potential V1 corresponding to the amount of light received at the photodiode PD. The signal detector circuit 16 reads the signal potential corresponding to the amount of light received at the photodiode PD in the period from the time T1 to a time T2.

At the time T2, the driver circuit 14 changes the reset control signal (the signal on the reset control line RSTk) for the pixel 13 from a low level to a high level. As a result, the potential of the signal line DDj corresponding to the potential of the photodiode PD changes from V1 to V2. During the period from a time T3 to a time T4, the signal detector circuit 16 reads the signal potential V2 after the photodiode PD is reset. The signal detector circuit 16 outputs a value (V1-V2) as the actual photodetection signal of the pixel.

Returning to FIG. 2, amplification of the potential (photodetection signal) of the photodiode PD by the amplifier transistor TAMP is explained. The output potential Vout of the voltage follower 203 in the reader circuit is the photodetection signal of the photodiode PD amplified by the amplifier transistor TAMP.

Specifically, the potential Vpd of the photodiode PD varies in accordance with the amount of light incident on the photodiode PD. The potential Vpd is supplied to the top gate TG of the amplifier transistor TAMP. When the selection transistor TVS becomes a conductive state in accordance with the selection signal on the selection line Gk, the potential of the signal line DDj varies so that the drain current of the amplifier transistor TAMP becomes equal to the constant current Iref of the current source.

The potential of the signal line DDj is input to the non-inverting input of the voltage follower 203 and transferred to the output of the voltage follower 203. A potential lower than the output voltage Vout of the voltage follower 203 by the voltage of the voltage source Vbs is supplied to the signal line DGj. The signal line DGj is connected with the bottom gate BG of the amplifier transistor TAMP.

When the amplifier transistor TAMP operates in the saturated region and the drain current (the current flowing through the channel between the drain and the source) in the saturated region is substantially independent from the drain-source voltage (∂Id/∂Vds=0), the following relation is satisfied:

$$Vout = -\frac{Ctg}{Cbg}Vtgs + \alpha = -\frac{Ctg}{Cbg}Vpd + \alpha' \quad (1)$$

where Ctg represents the top gate capacitance between the top gate TG and the semiconductor film of the amplifier transistor TAMP, Cbg represents the bottom gate capacitance between the bottom gate BG and the semiconductor film, Vtgs represents the voltage of the top gate with respect to the source of the amplifier transistor TAMP, and α and α' are constants. In view of the formula (1), the amplification rate for the potential Vpd of the photodetection signal of the photodiode PD can be made larger than 1 when Ctg>Cbg.

The foregoing is described in more details. The following approximation formula based on the gradual channel approximation is an example where the dependency of the drain current on the drain-source voltage is ignorable in the saturated region of a thin-film transistor.

$$Ids = \frac{W}{L}\mu Cox\frac{1}{2}(Vgs - Vth)^2 \quad (2)$$

The operation of a pixel 13 in an embodiment of this disclosure is described using the above formula (2). The amplifier transistor TAMP in FIG. 2 operates under the conditions of Ids=Iref, Vgs=Vout−Vbs, Vds=Vout, where Vgs represents the gate-source voltage (the voltage of the gate with respect to the source) and Vbs represents the voltage of the voltage source Vbs. The threshold voltage Vth of the amplifier transistor TAMP having a double-gate structure is expressed as the following formula:

$$Vth = Vth0 - \frac{Ctg}{Cbg}Vtgs \quad (3)$$

where Vth0 is a constant determined by the structure of the amplifier transistor TAMP.

When this value is substituted into the foregoing formula (2) the following formula is obtained:

$$Ids = Iref = \frac{W}{L}\mu Cox\frac{1}{2}\left\{Vout - Vbs - \left(Vth0 - \frac{Ctg}{Cbg}Vtgs\right)\right\}^2 \quad (4)$$

Assuming that the potential of the power line VB (the source potential) is 0, this formula (4) is rewritten as follows by solving with respect to Vout:

$$Vout = \sqrt{\frac{2Iref}{W\mu Cox}\frac{L}{}} + Vbs + Vth0 - \frac{Ctg}{Cbg}Vtgs = -\frac{Ctg}{Cbg}Vpd + \alpha' \qquad (5)$$

This is the same as the formula (1). The photodetection signal of the photodiode PD can be amplified at a specific amplification rate by making the amplifier transistor TAMP having a double gate structure operate in the saturated region as described above. The relational expression between the output potential Vout and the potential Vpd of the photodiode PD (the photodetection signal) does not depend on the kind of the approximation formula. When the drain current does not depend on the drain-source voltage, the foregoing relational expression is satisfied. When this dependency is smaller, the photodetection signal of the photodiode PD can be amplified more effectively.

Although the three transistors TAMP, TR, and TVS in the example of FIG. 2 are n-type transistors, a part or all of these transistors can be p-type transistors. Although the amplifier transistor TAMP in the example of FIG. 2 is supplied with the potential of the cathode of the photodiode PD, it can be supplied with the potential of the anode.

In the configuration example in FIG. 2, the bottom gate BG of the amplifier transistor TAMP is supplied with a potential lower than the output of the voltage follower by a certain voltage; however, the polarity of the voltage with respect to the bottom gate of the amplifier transistor depends on the circuit configuration. In order to generate a potential different from the potential of the signal line DD by a predetermined voltage without affecting the potential of the signal line DD, circuitry different from a voltage follower can be employed.

Figure 4:
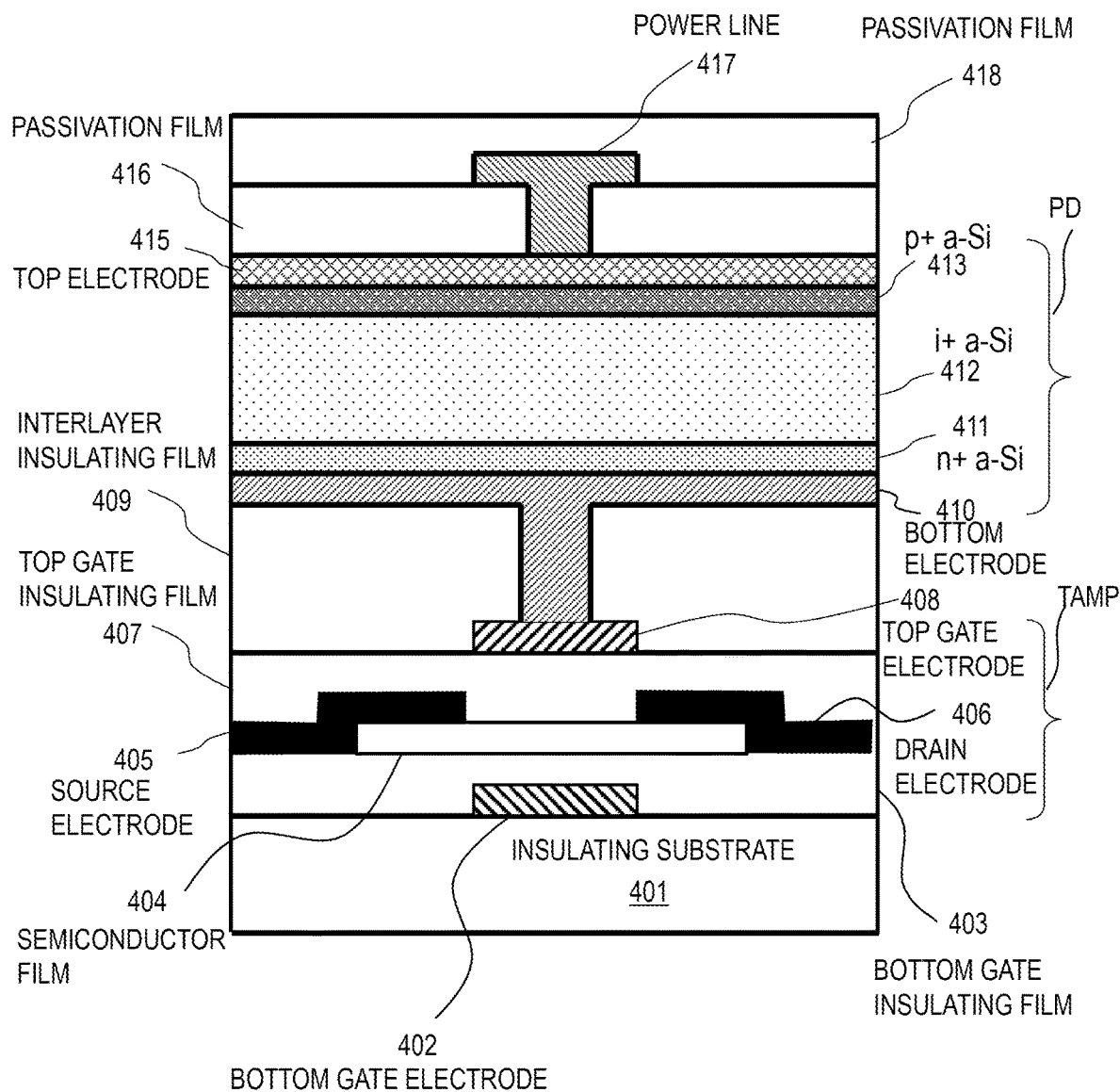
FIG. 4 is a cross-sectional diagram schematically illustrating an example of the device structure of an amplifier transistor and a photodiode.

Hereinafter, the device structure of a pixel 13 is described. FIG. 4 is a cross-sectional diagram schematically illustrating an example of the device structure of an amplifier transistor TAMP and a photodiode PD. The amplifier transistor TAMP and the photodiode PD are fabricated on an insulating substrate 401 such as a glass substrate or a resin substrate.

The amplifier transistor TAMP includes a bottom gate electrode 402 formed on the insulating substrate 401. The bottom gate electrode 402 can be made of an aluminum-based alloy.

A bottom gate insulating film 403 is provided above the insulating substrate 401 and the bottom gate electrode 402 to cover the bottom gate electrode 402. The bottom gate insulating film 403 can be a silicon oxide film, a silicon nitride film, or a laminate of these.

An island-like semiconductor film 404 is provided above the bottom gate insulating film 403. The semiconductor film 404 can be made of an oxide semiconductor. Examples of the oxide semiconductor are amorphous InGaZnO (a-InGaZnO) and microcrystalline InGaZnO. Furthermore, oxide semiconductors such as a-InSnZnO, a-InGaZnSnO, and ZnO are also applicable. Oxide semiconductors achieve transistors having higher saturation characteristics than the other thin-film semiconductor materials.

A source electrode 405 and a drain electrode 406 are formed to be in contact with a part of the top surface of the semiconductor film 404. The source electrode 405 and the drain electrode 406 can be made of titanium or molybdenum.

A top gate insulating film 407 is provided to cover the semiconductor film 404, the source electrode 405, and the drain electrode 406. The top gate insulating film 407 can be a silicon oxide film, a silicon nitride film, or a laminate of these. A top gate electrode 408 is formed above the top gate insulating film 407. The top gate electrode 408 can be made of an aluminum-based alloy. The top gate electrode 408 and the bottom gate electrode 402 are disposed to sandwich the semiconductor film 404 in the layering direction.

An interlayer insulating film 409 is provided above the top gate electrode 408 and the top gate insulating film 407. The interlayer insulating film 409 can be an inorganic or organic insulator film. A bottom electrode 410 of a photodiode PD is provided above the interlayer insulating film 409. The bottom electrode 410 is in contact with the top gate electrode 408 through a via hole in the interlayer insulating film 409. The bottom electrode 410 can be made of chromium.

An n-type amorphous silicon film 411, an intrinsic amorphous silicon film 412, a p-type amorphous silicon film 413 are stacked in this order above the bottom electrode 410. The materials of the silicon films of the photodiode are not limited to specific ones.

A top electrode 415 of the photodiode PD is provided above the p-type amorphous silicon film 413. The top electrode 415 can be made of a transparent metal, such as ITO.

A passivation film 416 is provided above the top electrode 415. The passivation film 416 is made of an insulator; it can be a silicon oxide film, a silicon nitride film, or a laminate of these.

A power line 417 is formed above the passivation film 416. The power line 417 is in contact with the top electrode 415 through a via hole in the passivation film 416. The power line 417 corresponds to the power line VB in FIG. 2. The power line 417 can be made of an aluminum-based alloy. A second passivation film 418 is provided above the power line 417 and the passivation film 416. The passivation film 418 covers the whole pixel 13. The passivation film 418 is made of an insulator; it can be a silicon oxide film, a silicon nitride film, or a laminate of these.

The photodiode PD in the configuration example of FIG. 4 is fabricated upper than the amplifier transistor TAMP. This structure enables the photodiode PD to receive light from the opposite side of the insulating substrate 401, preventing the insulating substrate 401 from reducing the light to be detected. Accordingly, efficient light detection is available. The bottom electrode 410 of the upper photodiode PD is in contact with the top gate electrode 408 of the lower amplifier transistor TAMP to achieve a simple structure. The positional relation between the photodiode and the amplifier transistor and the connections of the electrodes can be altered depending on the design.

As described above, the top gate capacitance between the top gate electrode 408 and the semiconductor film 404 is larger than the bottom gate capacitance between the bottom gate electrode 402 and the semiconductor film 404. This configuration enables the amplification rate of the detection signal of the photodiode PD to be higher than 1. If a terminal of the photodiode PD is connected with the bottom gate electrode, the amplifier transistor is configured so that the bottom gate capacitance will be larger than the top gate capacitance.

Figure 5:
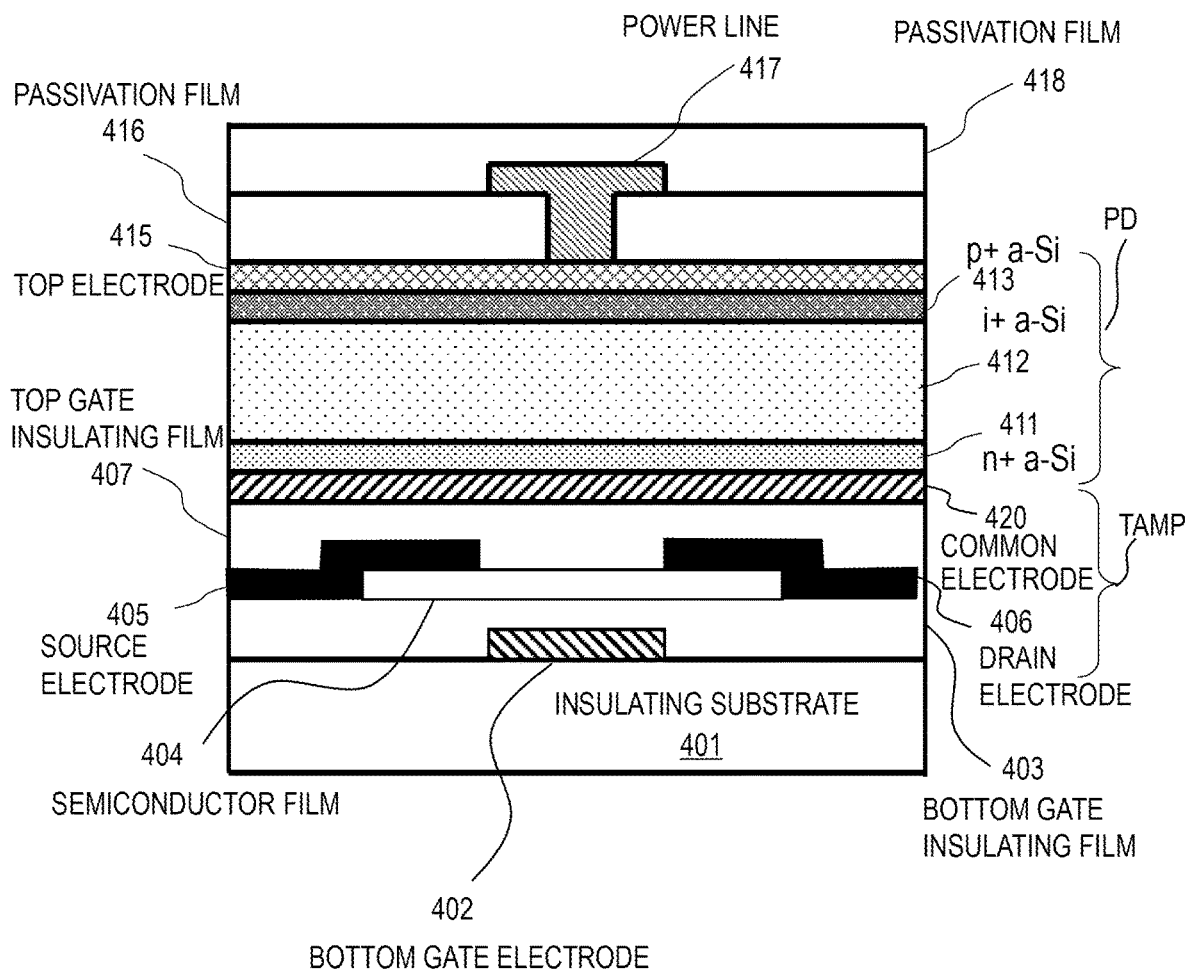
FIG. 5 is a cross-sectional diagram schematically illustrating another example of the device structure of an amplifier transistor and a photodiode.

FIG. 5 is a cross-sectional diagram schematically illustrating another example of the device structure of an amplifier transistor TAMP and a photodiode PD. Differences from the structural example illustrated in FIG. 4 are mainly described. In the structural example in FIG. 5, one common electrode 420 is shared by the photodiode PD and the amplifier transistor TAMP. Specifically, the common electrode 420 is the bottom electrode of the photodiode PD and also the top gate electrode of the amplifier transistor TAMP. The interlayer insulating film 409 shown in FIG. 4 is excluded. This one electrode shared between the photodiode PD and the amplifier transistor TAMP simplifies the manufacturing process of the sensor substrate 11.

Figure 6:
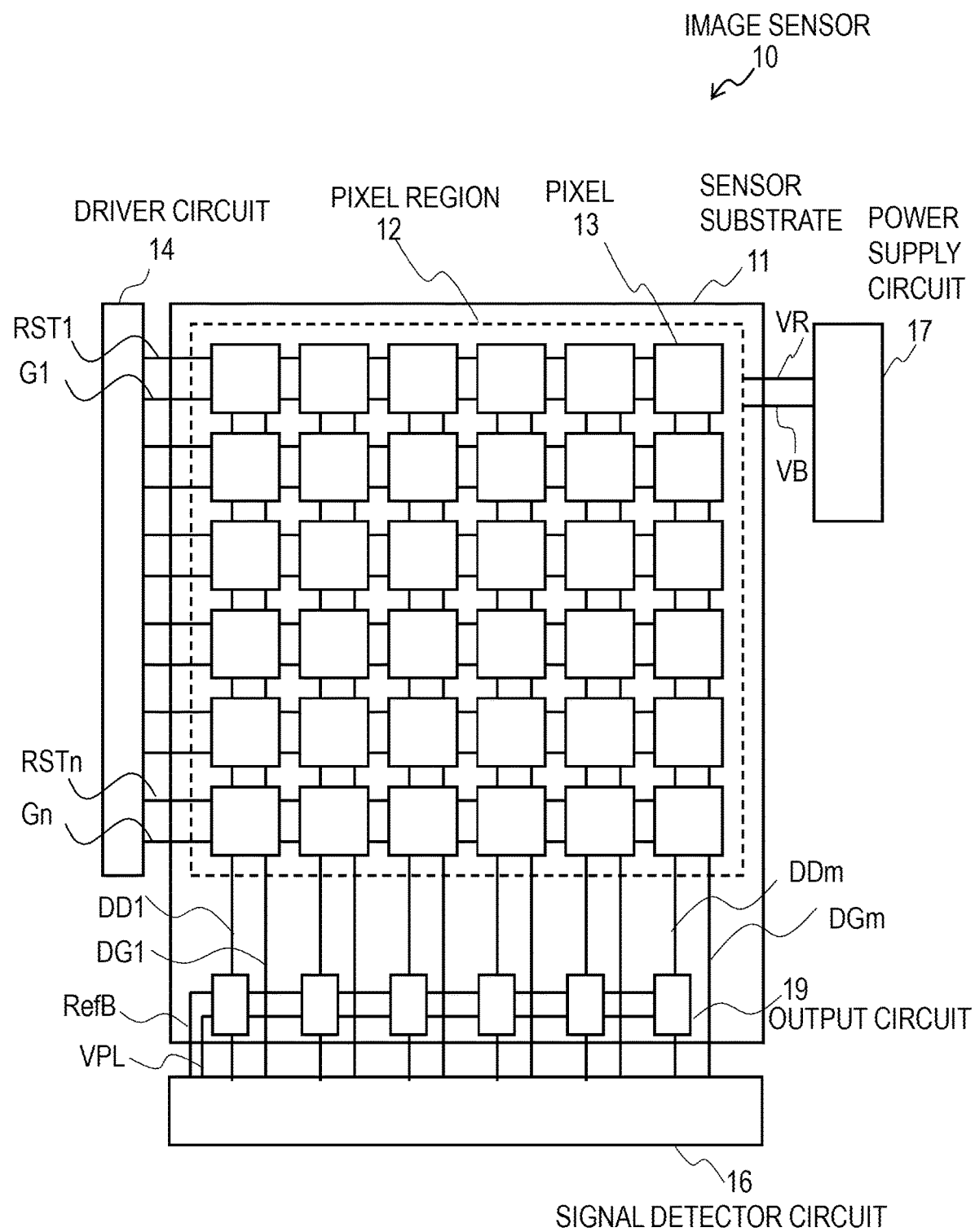
FIG. 6 is a block diagram illustrating another configuration example of an image sensor related to an embodiment of this disclosure.

FIG. 6 is a block diagram illustrating another configuration example of the image sensor related to an embodiment of this disclosure. Differences from the configuration example illustrated in FIG. 1 are mainly described in the following. A part of the signal detector circuit 16 in the configuration example of FIG. 1 is fabricated on the sensor substrate 11 as output circuits 19. The configuration example in FIG. 6 includes output circuits 19 each associated with a pixel column and only one of them is denoted by a reference sign 19.

Each output circuit 19 includes the constant current source 201 in the circuit diagram of FIG. 2. The signal line DDj for the associated pixel column extends from the output circuit 19. A power line VPL for transmitting the potential from the voltage source VP extends from the signal detector circuit 16 and it is connected with all output circuits 19. Further, a control signal line RefB extends from the signal detector circuit 16 and it is connected with all output circuits 19. The control signal line RefB transmits a signal for controlling the amount of current of the constant current source in the output circuit 19.

Figure 7:
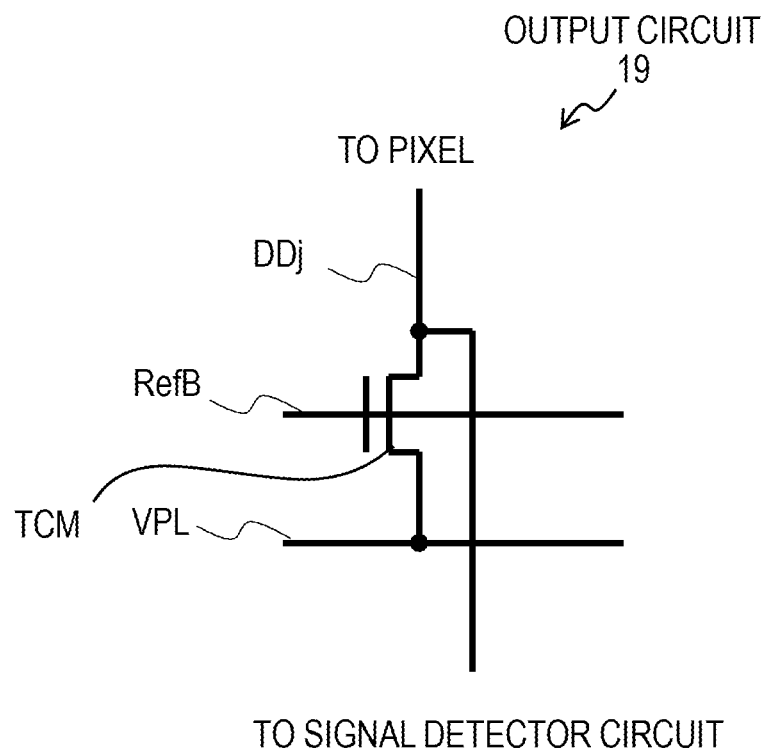
FIG. 7 illustrates a configuration example of an output circuit.

FIG. 7 illustrates a configuration example of an output circuit 19. Specifically, the output circuit 19 includes a transistor TCM. The gate of the transistor TCM is supplied with the control signal on the control signal line RefB. The drain of the transistor TCM is connected with the power line VPL and the source is connected with the signal line DDj. The control signal line RefB is supplied with a predetermined constant potential so that the constant current flows through the transistor TCM. For example, the transistor TCM can work as a current mirror circuit with a diode-connected transistor in the signal detector circuit 16.

Providing the constant current source of the signal detector circuit 16 on the sensor substrate 11 as described above simplifies the configuration of the signal detector circuit 16. Further, employing an oxide semiconductor transistor for the transistor TCM achieves a sophisticated constant current source because of its high saturation characteristics.

As described above, the image sensor of this disclosure maintains high SNR even if the image sensor has higher resolution, or smaller pixels.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. An image sensor comprising:
    an insulating substrate;
    a plurality of pixels on the insulating substrate; and
    a constant current source,
    wherein each of the plurality of pixels includes:
        a photoelectric conversion element;
        a first thin-film transistor having a first gate and a second gate disposed to sandwich a channel;
        a second thin-film transistor; and
        a third thin-film transistor,
    wherein the first gate is supplied with a signal generated by the photoelectric conversion element,
    wherein the constant current source supplies a constant current to the first thin-film transistor through a first signal line,
    wherein the second gate is supplied with a potential different from a potential of the first signal line by a predetermined voltage through a second signal line,
    wherein the second gate has a smaller capacitance than the first gate,
    wherein a gate of the second thin-film transistor is supplied with a reset control signal,
    wherein the second thin-film transistor supplies a reset potential received from a reset power line to the photoelectric conversion element,
    wherein whether the third thin-film transistor is in a conductive state is controlled by a selection signal input to the gate of the third thin-film transistor, and
    wherein the third thin-film transistor is disposed between the first signal line and the first thin-film transistor and the current from the constant current source flows into the first thin-film transistor via the third thin-film transistor in a conductive state.

2. The image sensor according to claim 1,
    wherein the first gate is disposed upper than the second gate, and
    wherein the photoelectric conversion element is disposed upper than the first thin-film transistor.

3. The image sensor according to claim 2,
    wherein the photoelectric conversion element includes a top electrode and a bottom electrode, and
    wherein the first gate is included in the bottom electrode.

4. The image sensor according to claim 1, wherein the first thin-film transistor is an oxide semiconductor transistor.

5. The image sensor according to claim 1, wherein the constant current source is disposed on the insulating substrate.

6. A method of controlling an image sensor including an insulating substrate and a plurality of pixels on the insulating substrate,
    each of the plurality of pixels including a photoelectric conversion element, a first thin-film transistor having a first gate and a second gate disposed to sandwich a channel in a layering direction, a second thin-film transistor, and a third thin-film transistor disposed between a first signal line and the first thin-film transistor,
    the second gate having a smaller capacitance than the first gate,
    the first gate being configured to be supplied with a signal generated by the photoelectric conversion element, and
    the method comprising:
        supplying a selection signal to a gate of the third thin-film transistor to control whether the third thin-film transistor is in a conductive state and supplying a constant current to the first thin-film transistor through the first signal line;
        supplying a potential different from a potential of the first signal line by a predetermined voltage to the second gate through a second signal line;
        outputting a potential corresponding to a potential of the first signal line;
        supplying a reset control signal to a gate of the second thin-film transistor; and supplying a reset potential of a reset power line to the photoelectric conversion element via the second thin-film transistor.

* * * * *